United States Patent

Eguchi

[11] Patent Number: 5,296,407
[45] Date of Patent: Mar. 22, 1994

[54] METHOD OF MANUFACTURING A CONTACT STRUCTURE FOR INTEGRATED CIRCUITS

[75] Inventor: Yoshikazu Eguchi, Suwa, Japan

[73] Assignee: Seiko Epson Corporation, Tokyo, Japan

[21] Appl. No.: 39,604

[22] Filed: Mar. 5, 1993

Related U.S. Application Data

[63] Continuation-in-part of Ser. No. 752,390, Aug. 30, 1991, abandoned.

[30] Foreign Application Priority Data

Aug. 30, 1990 [JP] Japan .................. 2-230290

[51] Int. Cl.⁵ .................. H01L 21/44; H01L 21/48
[52] U.S. Cl. .................. 437/195; 437/192
[58] Field of Search ............. 437/189, 192, 194, 195, 437/197, 198, 203, 230, 245

[56] References Cited

U.S. PATENT DOCUMENTS

| | | | |
|---|---|---|---|
| 3,900,944 | 8/1975 | Fuller et al. | 437/190 |
| 4,113,578 | 9/1978 | Del Monte | 437/230 |
| 4,184,909 | 1/1980 | Chang et al. | 437/190 |
| 4,267,012 | 5/1981 | Pierce et al. | 437/194 |
| 4,829,024 | 5/1989 | Klein et al. | 437/192 |
| 4,857,481 | 8/1989 | Tam et al. | 437/230 |
| 5,094,979 | 3/1992 | Kusano | 437/190 |
| 5,130,275 | 7/1992 | Dion | 437/192 |

FOREIGN PATENT DOCUMENTS

| | | | |
|---|---|---|---|
| 0142547 | 8/1983 | Japan | 437/192 |
| 0275625 | 11/1990 | Japan | 437/190 |

*Primary Examiner*—Tom Thomas
*Attorney, Agent, or Firm*—Raymond J. Werner

[57] ABSTRACT

Manufacturing a void-free metal-filled contact by forming an insulation layer about 2,000 Å thick between a substrate and a first conductive layer, forming openings, or contact holes, through the dielectric layer, forming a foundation metal system comprising an approximately 150 Å thick Ti layer, an approximately 1,000 Å thick TiN layer, an approximately 150 Å thick Ti layer and an approximately 1,000 Å thick Pt layer, patterning photoresist over the foundation metal system such that developed photoresist remains only where a conductive material is not desired, forming a conductive layer of gold by a plating process, stripping the photoresist, and ion milling to remove the foundation metal system that exists outside the contact holes. A second insulator layer is deposited and etched back until the gold film is exposed. A metal layer is deposited and patterned so that electrical connection can be made between the contacts and other parts of the circuitry.

14 Claims, 5 Drawing Sheets

METHOD OF MANUFACTURING A CONTACT STRUCTURE FOR INTEGRATED CIRCUITS

This is a continuation-in-part of the following U.S. application(s): Ser. No.: 07/752,390 filed on Aug. 30, 1991 now abandoned.

BACKGROUND OF THE INVENTION

The present invention relates to a method of manufacturing contact structures for integrated circuits and more particularly, manufacturing contact structures in submicron design rule integrated circuits by means of gold plating so as to prevent void formation due to self-shadowing during material deposition.

FIG. 2 is a cross-sectional view of a portion of an integrated circuit made by means of prior art processing technology which illustrates the problems inherent in producing a high aspect ratio contact structure.

FIG. 2, shows a silicon substrate 101, wherein semiconductor regions (not illustrated) such as diffusion layers are formed in its surface. In order to provide electrical isolation between these semiconductor regions and electrode wiring regions formed on the surface of silicon substrate 101, an insulation film comprising a silicon oxide film 102 5,000 Å to 6,000 Å thick is formed on the surface of silicon substrate 101 by a CVD method.

Contact holes 103 are formed in silicon oxide film 102 so as to provide physical pathways through it. At the bottoms of contact holes 103 silicon substrate contact regions 101a are exposed. Foundation metal layers 104 are formed on the surfaces of these opened contact regions 101a and on the inner surface sidewalls of contact holes 103, and on the surface of silicon oxide film 102 in portions peripheral to contact holes 103. These foundation metal layers 104 are constructed of 150 Å thick Ti layer 104a, 1,000 Å thick TiN layer 104b, 150 Å thick Ti layer 104c, and 1,000 Å thick Pt layer 104d, which are successively deposited over their surfaces by a sputtering method. Further, a wiring layer comprising Au layer 105 is adhered on the surface of Pt layer 104d of foundation metal layers 104 by non-electrolytic plating treatment, such that the interior portion of contact holes 103 are filled by Au layer 105.

Since the thickness of silicon oxide film 102 described above is 5,000 Å to 6,000 Å, contact hole 103 is relatively narrow compared to its depth (i.e. the aspect ratio is high). Further, Ti layer 104a, TiN layer 104b, Ti layer 104c and Pt layer 104d are accumulated as foundation metal layers 104 on the inner surfaces of contact hole 103, making the width of the opening still narrower.

When the interior of contact holes 103 are filled by Au film 105 by a non-electrolytic plating treatment, there is insufficient circulation of new plating liquid toward bottom surface sides 103a of contact holes 103, so that the growth rate of Au layer 105 at the bottom surface sides 103a is less than at the sidewalls 103b. Accordingly, Au film 105 grows in such a manner that it pushes out from the sidewalls of contact holes 103, and as this is happening, the circulation of new plating liquid decreases at the bottom surface 103a, thus decreasing the growth rate of Au film 105 still further at bottom surface 103a. As the plating process continues, Au film 105 closes the contact openings while leaving voids 105a in the interiors of contact holes 103, as shown in FIG. 2.

When Au film 105 is formed in this manner, the contact resistance increases because of the decrease in the degree of coverage of foundation metal layers 104 by Au film 105. Further, over the long term cracks develop from voids 105a which result in a decrease in integrated circuit reliability.

Therefore a need exists for a contact manufacturing process which produces void-free contact structures having low contact resistance and high long term reliability. What is desirable is a method for achieving a low aspect ratio during the contact-plug plating process step, while maintaining the fine line geometries necessary in submicron processing.

SUMMARY OF THE INVENTION

It is an object of the present invention to form contacts without interior voids.

It is a further object of the present invention to reduce contact resistance.

Accordingly, the manufacturing process of the present invention is one in which a contact without interior voids is produced by forming an insulation layer about 2,000 Å thick between a substrate and a first conductive layer, forming openings, or contact holes, through the dielectric layer, forming a foundation metal system comprising an approximately 150 Å thick Ti layer, an approximately 1,000 Å thick TiN layer, an approximately 150 Å thick Ti layer and an approximately 1,000 Å thick Pt layer, patterning photoresist over the foundation metal system such that developed photoresist remains only where a conductive material is not desired, forming a conductive layer of gold by a plating process, stripping the photoresist, and ion milling to remove the foundation metal system which is not masked by the gold film.

The plating process of the present invention allows the gold, as a liquid, to fill the contact holes without the self-shadowing that causes voids. Accordingly, the coverage of the foundation metal by the gold film increases thus providing reduced contact resistance, which is a desirable electrical characteristic. Because voids are substantially reduced if not eliminated, the formation of cracks is suppressed, thus increasing long term reliability.

An advantage of the present invention is elimination of voids in metal contacts by forming a relatively thin insulator layer, layering a foundation metal system in the contact hole and filling the remaining volume of the contact hole with a conductor, such as gold, by means of a plating process.

Other objects, attainments and advantages, together with a fuller understanding of the invention will become apparent and appreciated by referring to the following description and claims taken in conjunction with the accompanying drawings.

DETAILED DESCRIPTION OF THE INVENTION

The present invention is described with reference to FIGS. 1(a)–(i) which are cross sectional views of the structures produced by the various process steps.

OVERVIEW AND TERMINOLOGY

Voids formed in the interiors of contacts increase contact resistance, an undesirable electrical characteristic, and lead to long term reliability problems. The present invention is directed to a process of forming interlayer electrical connections with minimum contact resistance and good reliability.

The terms contact, via and window are sometimes used interchangeably in this field, and generally mean an opening in an interlayer insulator which provides a physical pathway for direct electrical connection. In this application the term contact hole refers to the actual opening in the interlayer dielectric, and contact refers to the completed structure including opening and electrically-conductive filling.

The terms chip, integrated circuit, semiconductor device and microelectronic device are also sometimes used interchangeably in this field. The present invention relates to the manufacture of chips, integrated circuits, semiconductor devices and microelectronic devices as these terms are commonly understood in the art.

PHYSICAL STRUCTURE

The structure of the present invention consists of an opening, or hole, in an interlayer dielectric in which is formed a multilayer foundation metal. In the preferred embodiment the relationship between the width of the contact opening and the contact depth is such that the depth is less than or equal to half the width of the contact opening. As is well-recognized by those of ordinary skill in the art, the depth of the contact hole is a function of the thickness of the interlayer dielectric through which electrical connection is to be made. In the preferred embodiment, this multilayer foundation metal is made of four layers. First a layer of Ti is formed on top of which is deposited a layer of TiN. Another layer of Ti is formed on top of the TiN layer, and a Pt film is used to form the top layer of the multilayer foundation metal. A conductor such as gold is then applied by a plating process to form the next level of interconnect.

In an alternative embodiment the Pt film between the gold layer and the second Ti layer can be left out such that the gold layer is in direct contact with the second Ti layer.

SPECIFIC PROCESS FLOW

Figure 1A:
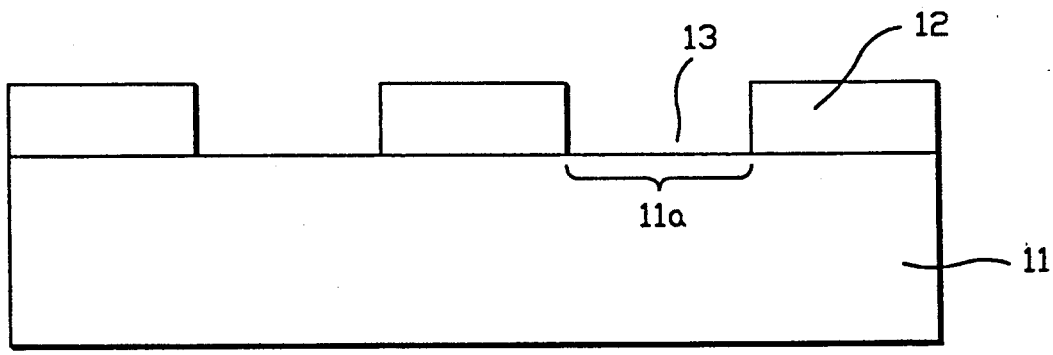
FIGS. 1(a)–(i) give cross sectional views of a microelectronic device at various stages of manufacturing by the method of the present invention.

As shown in FIG. 1(a), semiconductor regions such as diffusion layers (not illustrated) are formed in the surface of silicon substrate 11, and in order to provide electrical isolation between these semiconductor regions and the wiring layer formed above it, a silicon oxide insulation film 12 about 2,000 Å thick is formed by a CVD method over the surface of silicon substrate 11. Contact holes 13 are formed by etching through portions of silicon oxide film 12 which correspond to contact regions 11a.

Figure 1B:
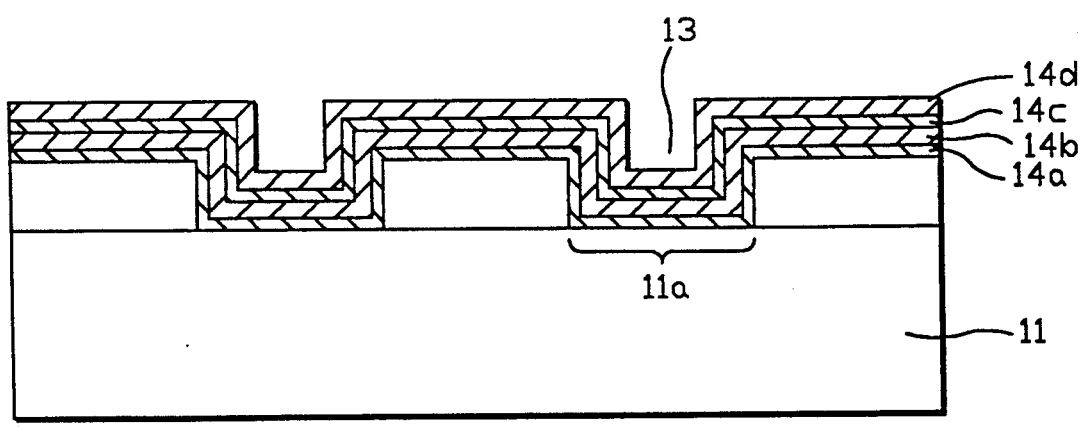

Next, as shown in FIG. 1(b), layers that will construct foundation metal 14 are successively formed by sputtering. In particular an approximately 150 Å thick Ti layer 14a is used as a contact metal layer for direct connection with contact region 11a on silicon substrate 11. The purpose of Ti layer 14a is to decrease contact resistance. An approximately 1,000 Å thick TiN layer 14b is then formed as a barrier layer that prevents alloying by diffusion of metal. An approximately 150 Å thick Ti layer 14c is then formed over TiN layer 14b in order to promote adhesion between the foundation metal 14 and the interconnect layer 15 which will be formed over the foundation metal 14. An approximately 1,000 Å thick Pt layer 14d is formed over Ti layer 14b, also to promote close adhesion. Ti layer 14a comprising the lowest layer of foundation metal layers 14 is in contact with contact regions 11a at the bottom of contact holes 13.

Figure 1C:
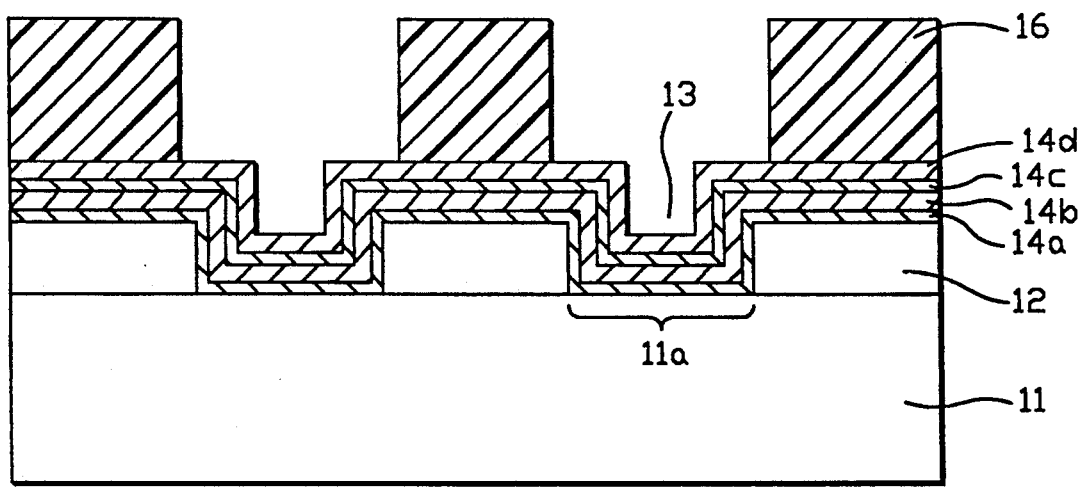

As shown in FIG. 1(c), photoresist layer 16 is formed on the surface of Pt layer 14d, the uppermost layer of foundation metal layers 14. In the preferred embodiment, the thickness of the photoresist layer is between 1 and 2 μm. After patterning, photoresist 16 has open regions corresponding to contact holes 13. Photoresist 16 may be positive resist, negative resist, multi-level resist or X-ray resist.

Figure 1D:
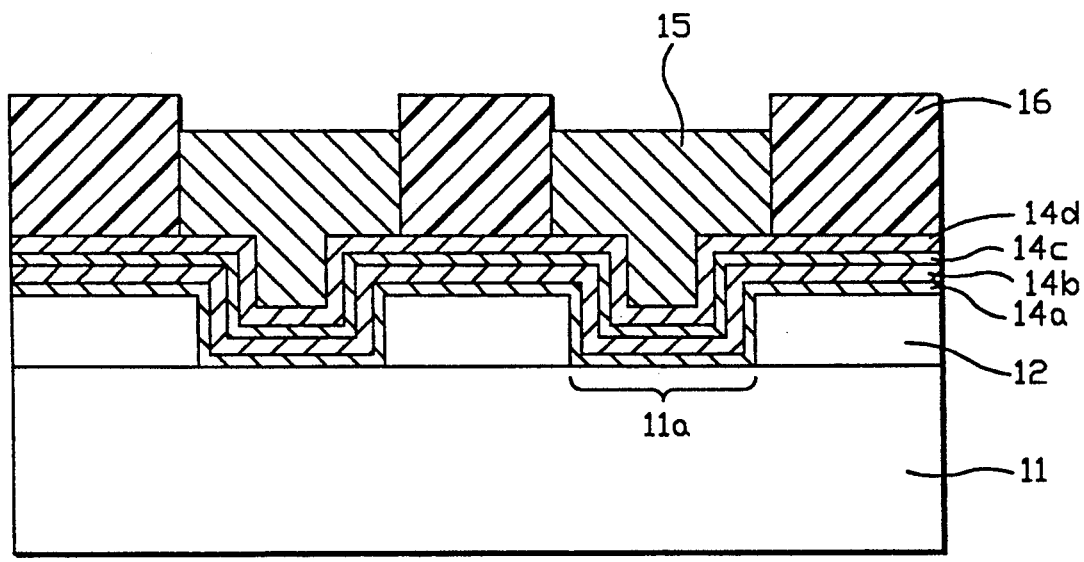

Next as shown in FIG. 1(d), Au film 15, approximately 1 μm thick, is formed by a non-electrolytic plating treatment on the surface of Pt layer 14d in the regions left exposed by photoresist layer 16, so that the interiors of contact holes 13 are filled by this Au film 15.

With regard to the non-electrolytic plating process used in the present invention, the plating liquid is a potassium aurous cyanide solution, the plating temperature is approximately 60° C., the pH is approximately 14, and the plating velocity is approximately 2 μm/hour (at 60° C.).

Figure 1E:
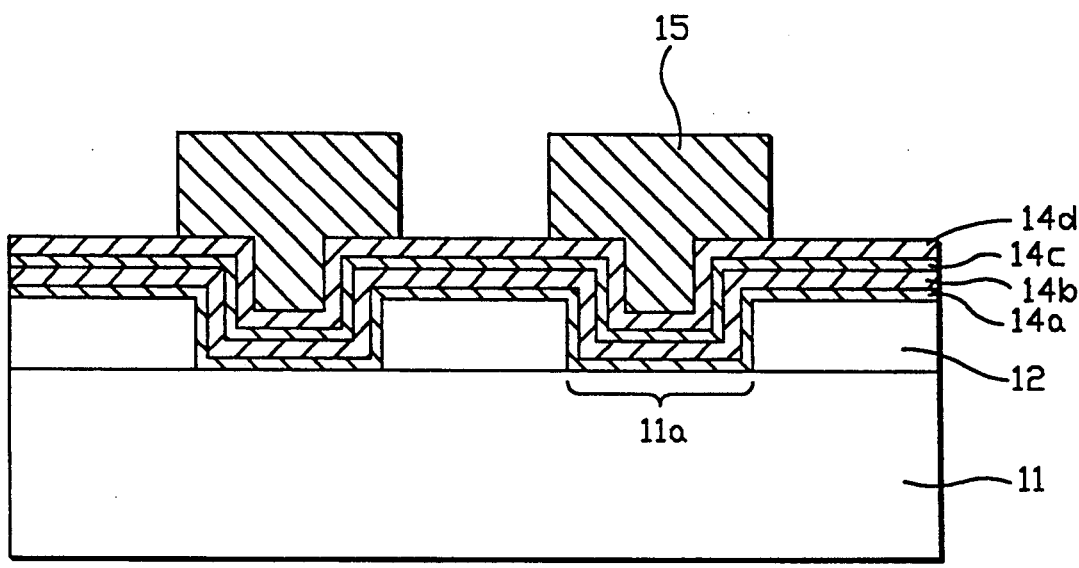
Figure 1F:
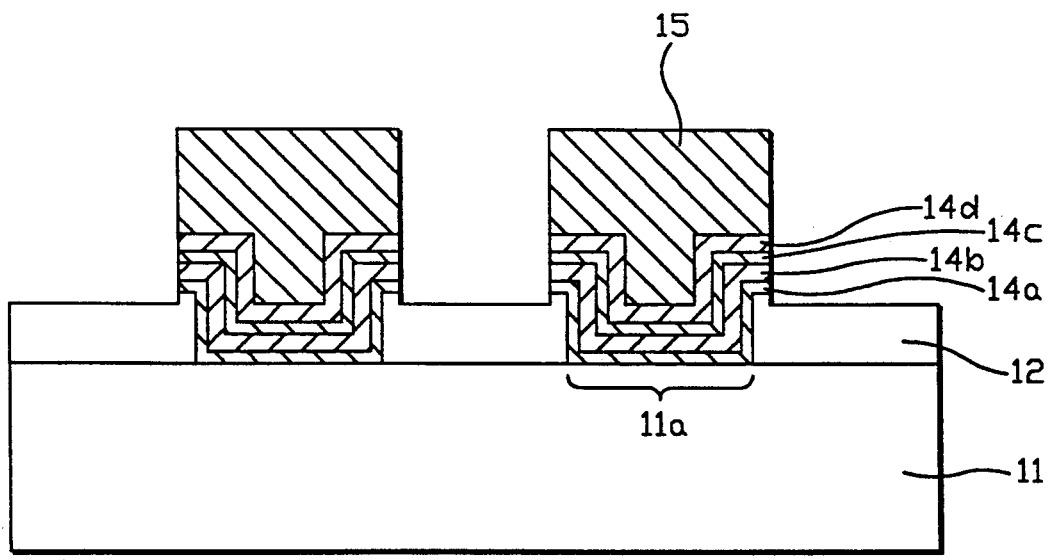

As shown in FIG. 1(e), photoresist layer 16 is then removed, and as shown in FIG. 1(f), foundation metal layers 14, where they are left exposed (i.e. uncovered) by Au film 15, are removed by an ion milling method with Ar ions together with a portion of silicon oxide film 12 directly beneath them. The ion energy used is approximately 500 ev and the acceleration voltage is approximately 500 volts.

Figure 1G:
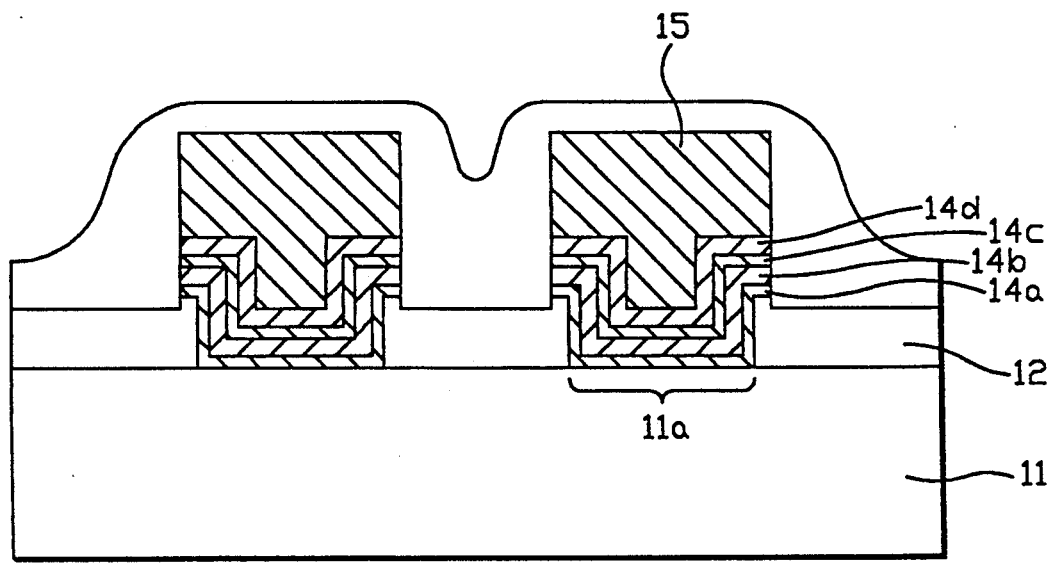
Figure 1H:
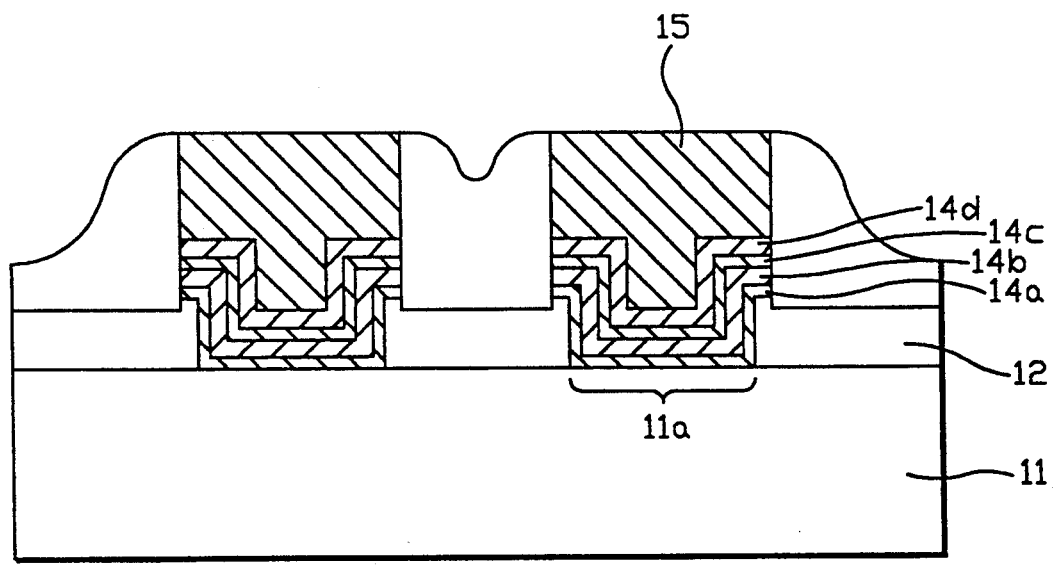
Figure 1I:
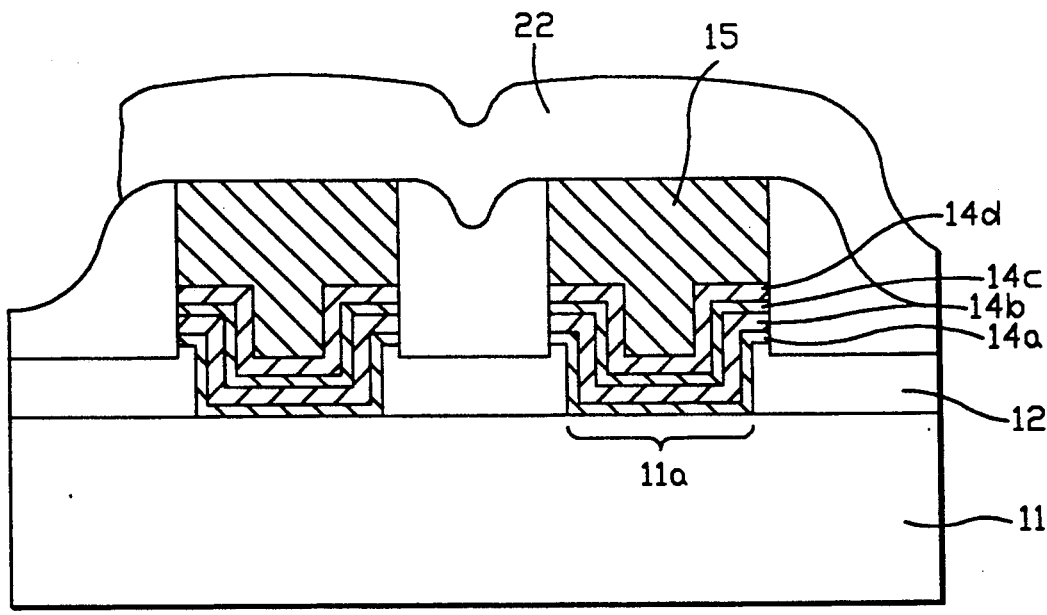
Figure 2:
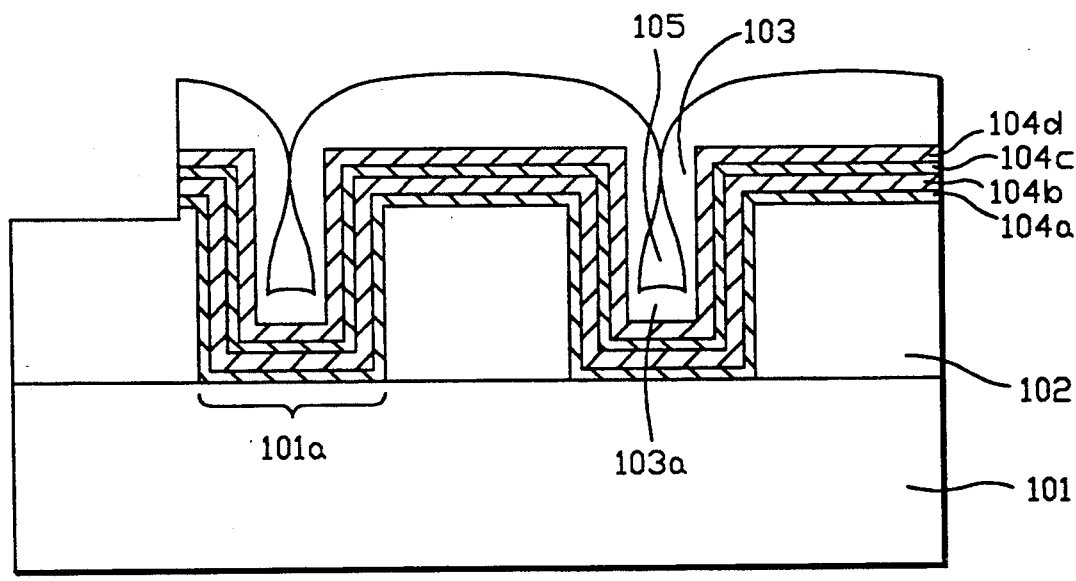
FIG. 2 is a cross-sectional view of a prior art device having a contact structure in which at least one of its layers of conductive fillers is formed by means of a plating process.

As shown in FIG. 1(g), silicon oxide film 21 is formed by a CVD method over the surface of the microelectronic device. After this, as shown in FIG. 1(h), silicon oxide film 21 is etched back so that the portion over Au film 15 is removed, leaving the surface of Au film 15 exposed. In this way, as shown in FIG. 1(i), Au film 15 can be placed in contact with other regions by Al wiring layer 22. As a result, an electrical pathway is constructed between contact regions 11a, through Al wiring layer 22. The Au layer acts a contact plug.

In the above example, as shown in FIGS. 1(c)–(d), the thickness of silicon oxide film 12 is about 2,000 Å when Au film 15 is formed, so that the structure is one where the widths of the openings of contact holes 13 are relatively wide compared to their depths. Also, even when foundation metal layers 14 accumulate on their inner surfaces, the openings still have a structure where the widths of the openings are relatively wide compared to their depths (i.e. the aspect ratio is low).

When the interiors of contact holes 13 of such a structure are contacted with Au film 15 by plating treatment, the new plating liquid circulates down to the bottom surface sides of contact holes 13, and Au film 15 grows at the same growth rate at the bottom surface sides and the opening edge sides of contact holes 13. Accordingly, Au film 15 fills the inside of the contact holes 13 from the bottom surfaces, and does not grow by pushing out from the sidewalls. As a result, Au film 15 fills the interior of contact holes 13 without leaving voids in their interiors. Because of this, coverage over foundation metal layers 14 is increased, and it is possible to decrease contact resistance, a desirable electrical characteristic. Further, formation of cracks caused by voids is eliminated, which increases reliability.

As shown in FIG. 1(f), when removing foundation metal layers 14 by ion milling, a portion of the surface of insulation film 12 is also removed simultaneously. Typically, this overetching removes approximately 500 Å–1,000 Å of insulation film 12. Accordingly, when insulation film 12 is extremely thin, there is a danger of damaging the active regions of silicon substrate 11. Because of this, the thickness of silicon oxide film 12 must be thin enough so that voids are consistently eliminated, but thick enough that the substrate is not affected by the ion milling process. In the preferred embodiment, about 2,000 Å has been found to be within the above-described range. In particular, when the depth of silicon oxide film 12 is about 2,000 Å, an aspect ratio typically less than ½ that of conventional contact holes is obtained.

Also, the growth rate of Au film 15 from the horizontal direction compared to the growth rate in the vertical direction may be considered as twice that of the vertical growth rate because it comes from two directions. Accordingly, under these conditions when the growth rate of Au film 15 at the bottom surface of contact holes 13 is equal to that on the sidewalls, a condition is fulfilled whereby Au film 15 growths from the inner surface sidewalls connect without blocking contact holes 13, from the bottom side surfaces of contact holes 13 until Au film 15 arrives at their upper surfaces.

When the contact hole is deep, the circulation of the plating liquid is insufficient to prevent a horizontal and vertical growth rate differential from developing. This growth rate differential leads to shadowing and void formation. The present invention utilizes a low aspect ratio structure, and accordingly, the plating liquid conforms to the shape of the contact hole, thus a void-free contact plug is formed. As a result, the coverage over the foundation metal layers is increased and correspondingly, the contact resistance is lowered. Also, void-induced crack formation, which leads to decreased chip reliability, is suppressed.

Further, although Au film 15 comprising the plated wiring metal layer in the present example was adhered to the foundation metal layer surface by non-electrolytic plating, it can also be adhered by electric plating.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A process of forming submicron structures for electrical connections between conductive regions in a substrate comprising the steps of:

a) forming a first silicon oxide film having a first thickness over said substrate;
    b) etching contact openings having a first width in said silicon oxide film;
    c) forming a foundation metal system over said substrate and said insulating layer;
    d) forming a layer of photoresist over said foundation metal system;
    e) patterning said photoresist such that said foundation metal system is exposed where said electrical connections will be formed;
    f) plating a first conductive material over said exposed foundation metal system;
    g) stripping said photoresist; and
    h) ion milling said foundation metal system with said conductive material as a mask until exposed portions of said foundation metal system and a portion of said silicon oxide film underlying said foundation metal system are removed;
    wherein said silicon oxide film has a thickness less than or equal to half the width of said contact openings.

2. The process of claim 1, wherein said first insulating layer comprises a silicon oxide film approximately 2,000 Å thick.

3. The process of claim 1, wherein said foundation metal system comprises a base layer of Ti approximately 150 Å thick, a second layer of TiN approximately 1,000 Å thick, and an uppermost layer of Ti approximately 150 Å thick.

4. The process of claim 3, wherein said foundation metal system further comprises a layer of Pt approximately 1,000 Å thick, disposed over said uppermost Ti layer.

5. The process of claim 4, wherein said plating step comprises applying potassium aurous cyanide solution at approximately 60° C. to said foundation metal system.

6. The process of claim 1, wherein said layer of photoresist comprises a positive resist.

7. The process of claim 1, wherein said layer of photoresist comprises a negative resist.

8. The process of claim 1, wherein said layer of photoresist comprises an X-ray resist.

9. The process of claim 1, wherein said layer of photoresist comprises a multi-level resist.

10. The process of claim 1, wherein said first conductive material is gold.

11. The process of claim 1, wherein said ion milling is performed with Ar ions.

12. The process of claim 1 further comprising the steps of:

a) forming an insulating layer over said first conductive material;
    b) etching back said insulating layer such that the surface of said first conductive material is exposed;
    c) depositing a second conductive material over said second insulating layer and said exposed first conductive material; and
    d) patterning said second conductive material to form individual electrical interconnections.

13. The process of claim 12, wherein said insulating layer is a silicon oxide film.

14. The process of claim 10, wherein said second conductive film is Al.

* * * * *